(12) United States Patent  
Liu et al.

(10) Patent No.: US 7,153,755 B2
(45) Date of Patent: Dec. 26, 2006

(54) PROCESS TO IMPROVE PROGRAMMING OF MEMORY CELLS

(75) Inventors: Shih-Chang Liu, Yong Kang (TW); Wen-Ting Chu, Kaohsiung County (TW); Chien-Ming Ku, Hsinchu (TW); Chi-Hsin Lo, Jhubei (TW); Chia-Shiung Tsai, Hsin-chu (TW); Chia-Ta Hsieh, Tainan (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 37 days.

(21) Appl. No.: 11/044,813

(22) Filed: Jan. 26, 2005

(65) Prior Publication Data

US 2006/0163686 A1 Jul. 27, 2006

(51) Int. Cl.
H01L 21/762 (2006.01)
(52) U.S. Cl. .............................. 438/424; 257/E21.546
(58) Field of Classification Search ................ 438/424, 438/FOR. 227, 952; 257/E21.546
See application file for complete search history.

(56) References Cited

U.S. PATENT DOCUMENTS

| | | | |
|---|---|---|---|
| 5,889,689 A | 3/1999 | Alidina et al. | |
| 5,933,749 A | 8/1999 | Lee | |
| 6,043,562 A | 3/2000 | Keeth | |
| 6,125,059 A | 9/2000 | Hecht | |
| 6,191,980 B1 | 2/2001 | Kelley et al. | |
| 6,238,983 B1 | 5/2001 | Chu et al. | |
| 6,239,002 B1 | 5/2001 | Jang et al. | |
| 6,265,267 B1 | 7/2001 | Huang | |
| 6,281,089 B1 | 8/2001 | Chen | |
| 6,436,763 B1 | 8/2002 | Huang et al. | |
| 6,437,397 B1 | 8/2002 | Lin et al. | |
| 6,552,360 B1 | 4/2003 | Su et al. | |
| 6,576,949 B1 | 6/2003 | Park | |
| 6,593,606 B1 | 7/2003 | Randolph et al. | |
| 6,610,580 B1 * | 8/2003 | Chan et al. | 438/424 |
| 6,667,201 B1 | 12/2003 | Jang | |
| 6,682,978 B1 | 1/2004 | Park et al. | |
| 6,696,329 B1 | 2/2004 | Nakagawa | |
| 6,717,850 B1 | 4/2004 | Li et al. | |
| 6,720,217 B1 * | 4/2004 | Kim et al. | 438/257 |
| 6,759,707 B1 | 7/2004 | Prall | |
| 6,781,186 B1 | 8/2004 | Wu | |
| 6,781,191 B1 | 8/2004 | Lin | |
| 6,784,077 B1 | 8/2004 | Lin et al. | |
| 6,794,263 B1 * | 9/2004 | Lee et al. | 438/401 |
| 2005/0202638 A1 * | 9/2005 | Yang et al. | 438/275 |
| 2006/0086971 A1 * | 4/2006 | Takahashi et al. | 257/324 |

* cited by examiner

Primary Examiner—George Fourson
(74) Attorney, Agent, or Firm—Duane Morris LLP

(57) ABSTRACT

A method is provided for fabrication of a semiconductor substrate having regions isolated from each other by shallow trench isolation (STI) structures protruding above a surface of the substrate by a step height. The method includes the steps of forming a bottom antireflective coating (BARC) layer overlying the surface of a semiconductor substrate and the surface of STI structures; etching back a portion of the BARC layer overlying at least one of the STI structures, and partially etching back the at least one of the STI structures, to reduce the step height by which the STI structure protrudes above the surface of the substrate; and removing a remaining portion of the BARC layer between adjacent STI structures. The method may be used to fabricate semiconductor devices including memory cells that have improved reliability.

16 Claims, 6 Drawing Sheets

PROCESS TO IMPROVE PROGRAMMING OF MEMORY CELLS

FIELD OF THE INVENTION

The present invention relates generally to a fabrication method for semiconductor devices. More particularly, the present invention relates to a fabrication method for memory cells.

BACKGROUND

Integrating different devices, such as the memory cell and the logic circuit on the same wafer has become a trend in the semiconductor industry. This has provided portable electronic devices such as digital cameras, notebooks, personal digital assistants (PDA), mobile phones, and the like. All of these devices need a dependable and convenient method to maintain their information and/or data for substantial periods of time without refresh cycles and/or power—non-volatile memory. A widely utilized type of non-volatile memory device is flash memory. Flash memory devices achieve relatively high speeds of operation and are able to maintain their data without power and/or refresh cycles.

A few examples of non-volatile semiconductor memory include read only memory (ROM), programmable read only memory (PROM), erasable programmable read only memory (EPROM), electrically erasable programmable read only memory (EEPROM) and flash EEPROM. Semiconductor EEPROM devices involve more complex processing and testing procedures than ROM, but have the advantage of electrical erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of programming and/or erasing multiple memory cells at once, hence the term flash EEPROM.

The specific structure of flash memory cells can be varied and include, for example, those described in U.S. Pat. Nos. 6,667,201; 6,281,089; 6,720,217; and 6,265,267. The components of the memory cells, and the memory cells in an array are isolated from each other, typically by the use of shallow trench isolation structures (STI). Methods of forming STI structures in a semiconductor substrate are well known in the art and include, for example, those described in U.S. Pat. Nos. 6,239,002; 5,933,749; and 6,784,077.

Flash memory devices are programmed and erased by pulses that place charges in selected memory cells or drain charges away. Additionally, blocks and arrays of memory cells can be erased at a single time by an erase operation such as a channel erase. For example, U.S. Pat. Nos. 6,552,360; 6,593,606; 5,889,698; 6,191,980; and 6,125,059 describe programming of these type devices.

Erase operations for flash memory devices are typically performed at greater voltage levels than those used in standard non-flash memory devices. Such erase operations can cause operation of flash memory devices and the devices themselves to be susceptible to extrinsic defects, introduced in the fabrication process. Costly and time intensive testing can be performed to identify devices with extrinsic defects, such as that described in U.S. Pat. No. 6,717,850. Although the defective memory cells can be identified by this testing, the extrinsic defects are not necessarily identified. An understanding of the specific defect and an improved fabrication process that eliminates the extrinsic defect(s) are desired.

SUMMARY OF THE INVENTION

In some embodiments, a method comprises the steps of providing a semiconductor substrate having regions isolated from each other by shallow trench isolation (STI) structures protruding above a surface of the substrate by a step height; forming a bottom antireflective coating (BARC) layer overlying the surface of the substrate and the STI structures; etching back a portion of the BARC layer overlying at least one of the STI structures, and partially etching back the at least one STI structure, to reduce the step height by which the STI structure protrudes above the surface of the substrate; and removing a remaining portion of the BARC layer between adjacent STI structures

DETAILED DESCRIPTION

Figure 1A:
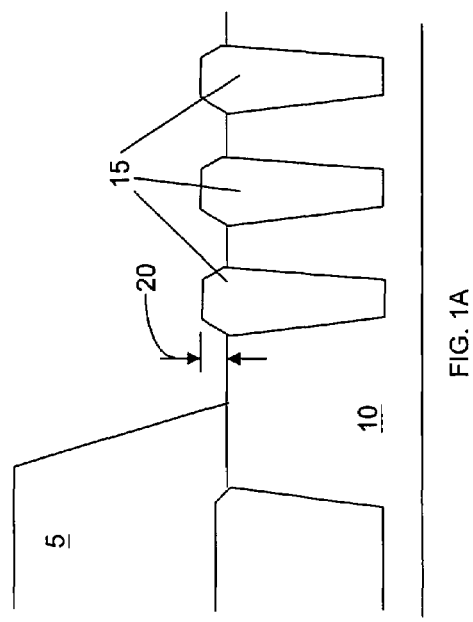
FIG. 1A–1B show steps of a fabrication method known in the art.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Semiconductor wafers comprising an embedded flash memory array and control circuitry were fabricated by a commercial method. Test programming and analysis was then conducted on multiple wafers, and individual memory cells of each wafer were identified that passed the test and those that failed the test due to weak programming.

Cross-sections of multiple pass and failed memory cells from each wafer were prepared by microtomy, and the physical structure of each memory cell region was determined by electron microscopy. The physical structure under the Floating Gate (FG), Write Line (WL), and Select Line of each memory cell was noted. Table 1 shows the results for four memory cells. The results for these four memory cells were typical for the multiple memory cells analyzed. The major difference observed between memory cells that passed and memory cells that failed due to weak programming was the step height by which the STI structures protruded above the substrates surface in the FG and WL regions. Table 1, shows that memory cells having a STI step height no more than about 500 angstroms above the substrates surface passed the test. Memory cells having a STI step height above the substrate surface greater than 500 angstroms generally failed the test.

TABLE 1

| Sample Cell | STI Step Height/FG | STI Step Height/WL | Test Result |
| --- | --- | --- | --- |
| 1 | 495.5 A | 483.4 A | Pass |
| 2 | 652.6 A | 640.5 A | Fail |
| 3 | 427.2 A | 402.8 A | Pass |
| 4. | 463.9 A | 439.5 A | Pass |

Therefore, efforts were made to find a simple, cost affective method for controlling STI step height within the wafer fabricating process. In one example (not shown), for cell step height reduction, two masks (active area periphery etching and active area cell etching) had been used and results show the method is effective. But the extra-mask can increase costs for production.

Figure 1B:
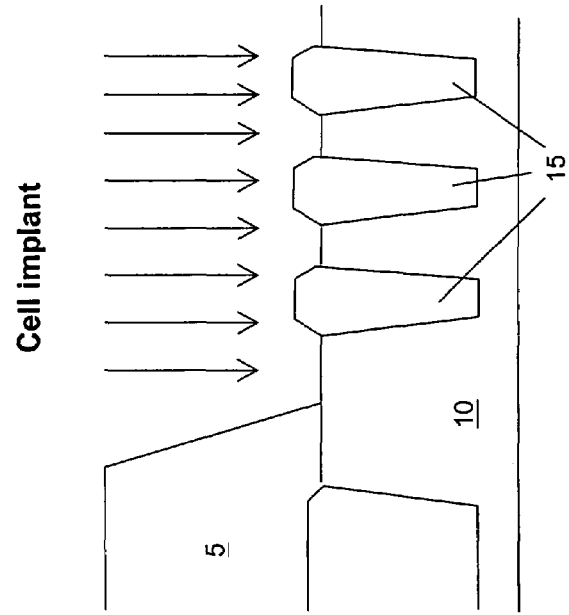
Figure 2B:
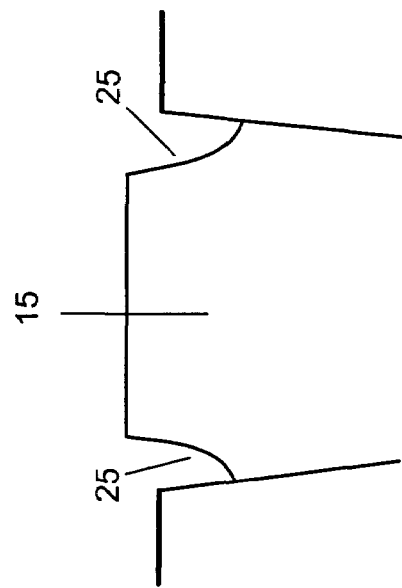
FIG. 2A and FIG. 2B are, respectively, a cross-sectional view and an exploded cross-sectional view of the structure of FIG. 1A, after partial wet etching with hydrofluoric acid.
Figure 2A:
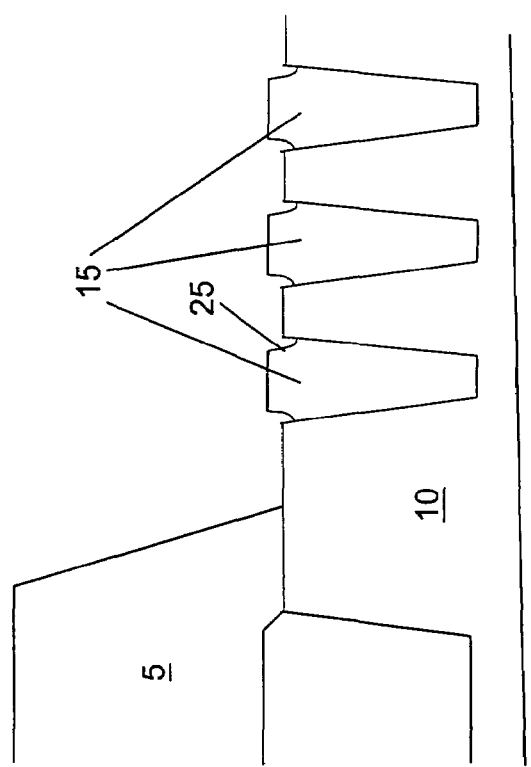

FIGS. 1A–1B show another wafer fabrication process that includes the steps of applying a photoresist 5 to protect a region of the semiconductor substrate 10, followed by a cell ion implantation step into active regions of substrate 10 isolated by STI structures 15 having a step height 20 protruding above the substrate's surface. FIG. 2A shows the results of a hydrofluoric acid wet etching back process of STI structure 15 of FIG. 1A. This process etches away STI structure 15 adjacent substrate 10 and creates serious divot/ditch defects 25 as shown in FIG. 2B. STI divot defects 25 have a negative effect on the performance of the memory cells in the final product.

FIG. 3A through FIG. 3E show one embodiment of a method according to the present invention. In this embodiment, it is possible to perform step height reduction and dopant implants using a single mask.

Figure 3A:
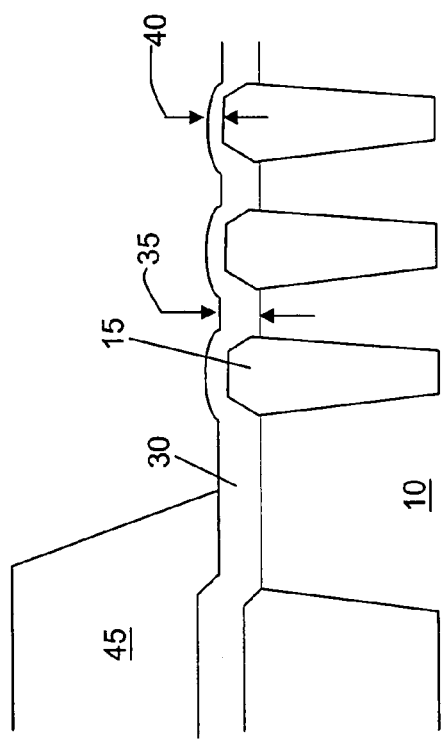
FIGS. 3A–3E show one embodiment of the method of the present invention.

FIG. 3A shows a semiconductor substrate 10 having regions isolated from each other by shallow trench isolation (STI) structures 15 protruding above the substrate's surface by a step height 20. A bottom antireflective coating (BARC) layer 30 has been formed, overlying the surface of substrate 10 and STI structures 15. BARC layer 30 may comprise inorganic or organic material. In some embodiments, BARC layer 30 comprises organic material that is photocurable. For example, the BARC layer 30 may be a photoresist. It is noted that the term "BARC", as used herein refers to any material suitable as an antirelective coating layer underlying a photoresist layer and can be conveniently removed afterwards. It may be a standard BARC material commonly used in this industry, any organic or inorganic material, or may be a photoresist material itself.

BARC layer 30 may be applied by any technique, for example, spin coating. An exemplary machine for applying the BARC is a single or dual track photoresist coater. In some embodiments, BARC layer 30 is applied so that a thickness 35 (shown in FIG. 3E) of BARC 30 in between adjacent STI structures 15 is greater than a thickness 40 of the BARC layer 30 overlying the STI structures 15. A photoresist layer 45 has been formed on a portion of BARC layer 30. Photoresist layer 45 does not cover the BARC layer 30 adjacent to and overlying at least one STI structure 15.

Figure 3B:
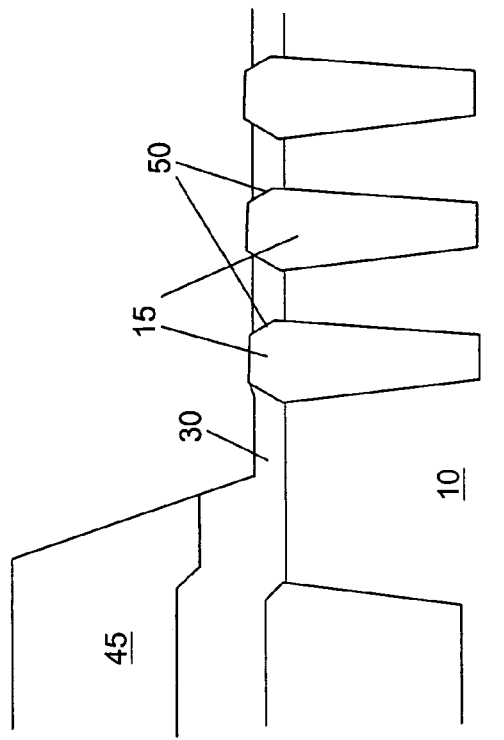

FIG. 3B shows the results of etching back a portion of BARC layer 30 overlying at least one of the STI structures 15 of FIG. 3A. In some embodiments, wherein the BARC layer 30 comprises organic material, the etching back occurs by an oxygen plasma. In some embodiments, BARC layer 30 overlying at least one STI structure 15 is completely removed. In some embodiments, a portion of BARC layer 30 overlying corners 50 of STI structure 15 is not removed. In some embodiments, a TCP® 9400DFM silicon etch system by Lam Research Corporation of Fremont, Calif., is used for in situ oxygen plasma etching, with the etch conditions of about 5 to about 100 mtorr pressure/about 10 to about 300 W/and about 10 to about 500 standard cubic centimeters per minute (sccm) of $O_2$. Because the thickness 40 of the BARC layer 30 over the STI structures 15 is less than the thickness of the BARC layer 30 between the STI regions, an etching process can remove all of the BARC over the STI structure without removing all of the BARC in between STI structures, without masking the regions between the STI structures. A non-limiting example of the thickness of the BARC includes from about 5 nm to about 100 nm thickness over the STI, and from about 20 nm to about 300 nm thickness between the STIs.

Figure 3C:
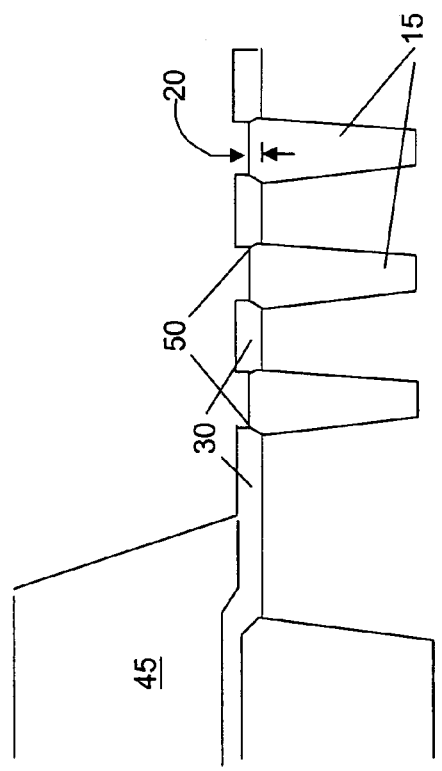

FIG. 3C shows the results of partially etching back at least one STI structure 15 of FIG. 3B, to reduce the step height 20 by which STI structure 15 protrudes above the surface of the substrate 10. BARC layer 30 protects the corners 50 of STI structures 15, reducing formation of STI divot defects. In some embodiments, the etch-back process is a wet etch-back process, for example, using hydrofluoric acid. In some embodiments, general BARC etching recipes (such as $O_2/Cl_2$ gas) may be used. In some embodiments, the partially etched back STI structures 15 have a step height 20 of no more than 500 angstroms. In other embodiments, the partially etched back STI structures 15 have a step height 20 of no more than 350 angstroms. In another example, the step height before partially etching back the STI structure is about 600 angstroms, and the step height after partially etching back the STI structure is about 300 angstroms.

In preferred embodiments, a single etching process may be used both to etch back a portion of BARC layer 30 and partially etch back the at least one STI structure 15. The etchant and the duration of etching are preferably selected so that the step height of the STI structure is reduced to a desired value without completely removing all of the BARC layer in the regions between STI structures. Preferably, the etch rate of the etchant for the material of the STI structure is faster than the etch rate of the same etchant for the BARC.

Figure 3D:
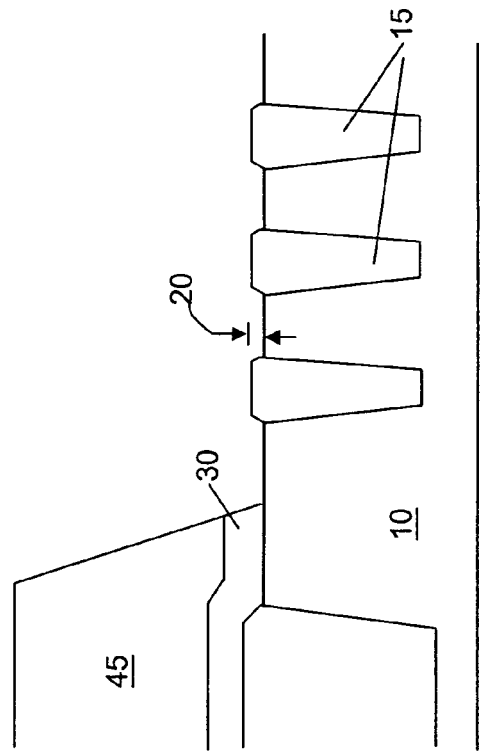

FIG. 3D shows the results after the remaining BARC layer 30 of FIG. 3C is removed. In some embodiments, wherein BARC layer 30 is organic, the remaining BARC layer 30 may be removed by ashing techniques. If the BARC layer is inorganic, a non-limiting example of a process step for removing the remaining inorganic BARC layer includes using a wet solution to dissolve such inorganic materials, where the etchant has a high selectivity to oxide and Si. Although not shown, additional cleaning steps may be used after removing the remaining BARC layer 30, if desired.

Figure 3E:
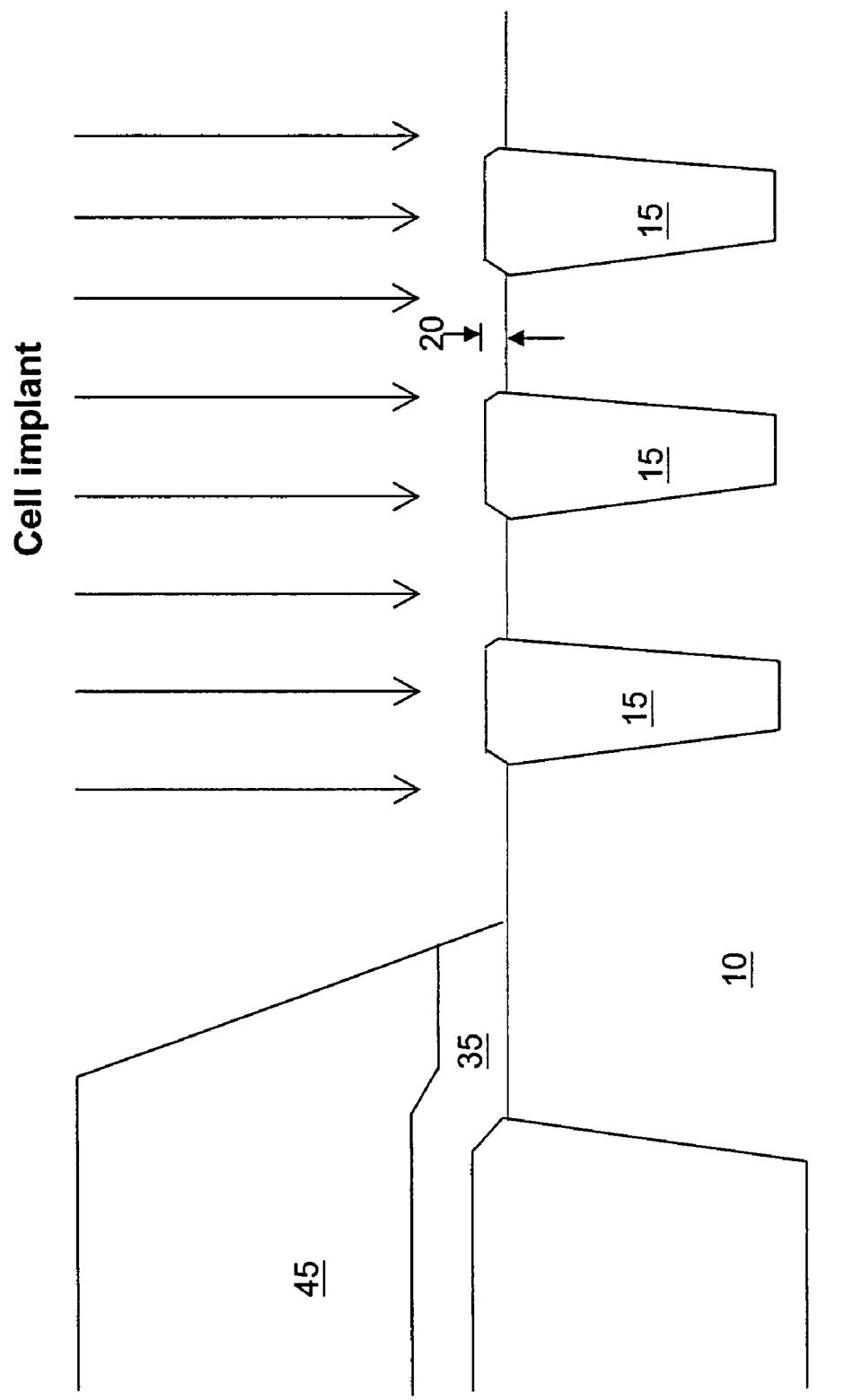

FIG. 3E shows that an implantation step may be subsequently conducted into the regions of the substrate not protected by photoresist layer 45.

Figure 4:
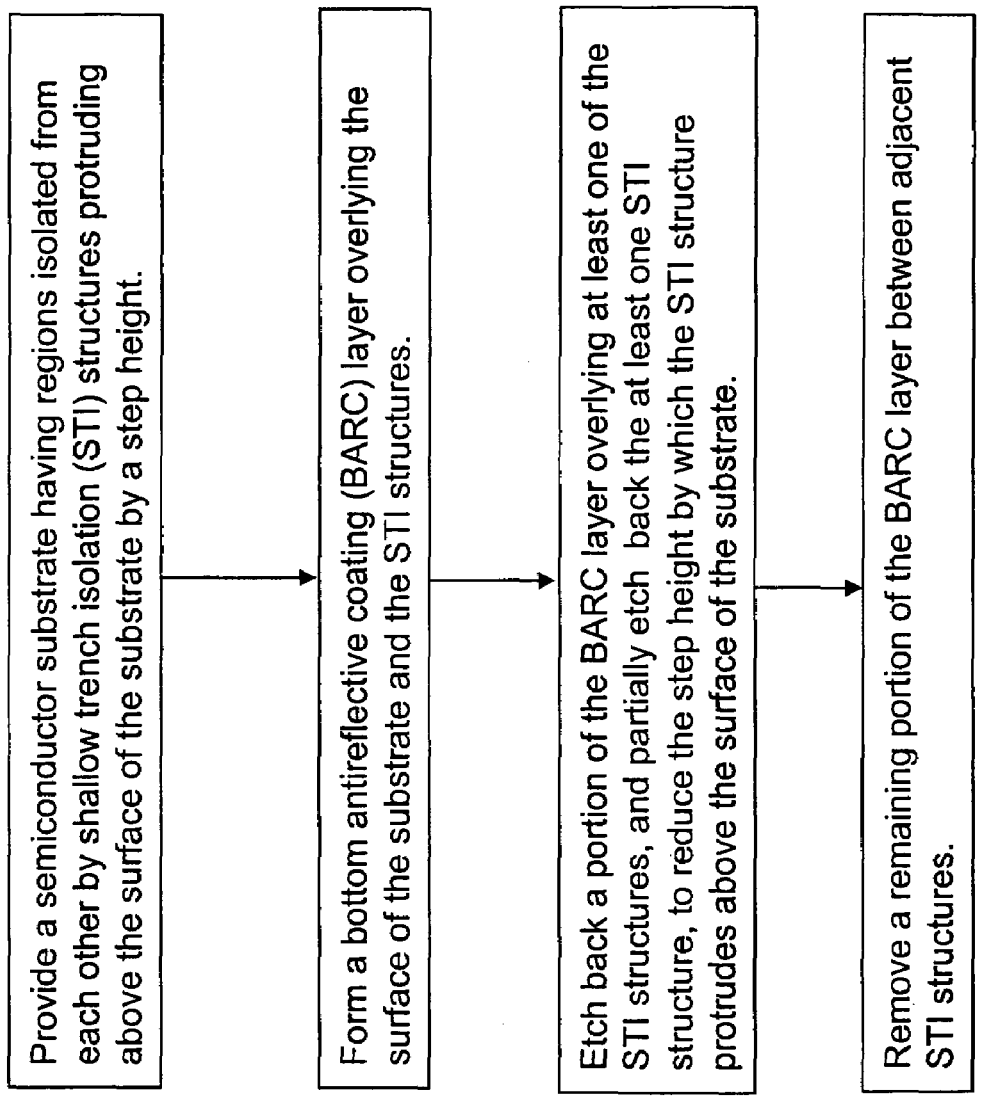
FIG. 4 is a process flow diagram of one embodiment of the present invention.

The process as described in FIG. 4 provides a substrate 10 having STI structures 15 with reduced step heights 20 designed to provide memory cells with improved reliability.

Although an example is provided in which the above-described method provides a reduced step height that is advantageous for fabricating flash memory cells, the method may be used for any type of memory cells (e.g. DRAM, SRAM, flash, or the like), and more generally, for any integrated circuit in which it is desired to reduce a step height of one or more STI structures above the substrate surface. For example, the techniques described above may also be used for CMOS image sensors (CIS).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising the steps of:
    (a) providing a semiconductor substrate having regions isolated from each other by shallow trench isolation (STI) structures protruding above a surface of the substrate by a step height;
    (b) forming a bottom antireflective coating (BARC) layer overlying the surface of said substrate and said STI structures;
    (c) etching back a portion of the BARC layer overlying at least one of said STI structures, and partially etching back the at least one STI structure, to reduce the step height by which the STI structure protrudes above the surface of the substrate; and
    (d) removing a remaining portion of the BARC layer between adjacent STI structures.

2. The method of claim 1, wherein step (b) includes depositing a BARC material so that a thickness of the BARC material in between adjacent STI structures is greater than a thickness of the BARC material over the STI structures.

3. The method of claim 1, wherein the step of etching back a portion of the BARC layer includes keeping a portion of the BARC layer overlying corners of the STI structure.

4. The method of claim 1, wherein step (c) is performed without masking the BARC material in between adjacent STI structures.

5. The method of claim 1, wherein a single etching process is used in step (c) to etch back a portion of the BARC layer and partially etch back the at least one STI structure.

6. The method of claim 1, wherein step (d) is performed before implanting a dopant in a device on the substrate.

7. The method of claim 1, wherein said method is used to fabricate at least one memory cell.

8. The method of claim 2, wherein said method is used to fabricate at least one flash memory cell.

9. The method of claim 1, wherein said BARC layer is an organic material.

10. The method of claim 9 wherein the portion of the BARC layer is etched back using an oxygen plasma process.

11. The method of claim 9, wherein the remaining BARC layer is removed by an ashing process.

12. The method of claim 1, wherein step (c) provides a divot free STI structure.

13. The method of claim 1, wherein said partial etch back of the STI structure comprises a wet etch process.

14. The method of claim 1, wherein the step height of said at least one STI structure after step (c) is about 500 angstroms or less.

15. The method of claim 14, wherein said step height after step (c) is about 350 angstroms or less.

16. The method of claim 1, wherein said BARC is a photoresist.

* * * * *